United States Patent
Wu et al.

(10) Patent No.: US 10,922,023 B2
(45) Date of Patent: Feb. 16, 2021

(54) METHOD FOR ACCESSING CODE SRAM AND ELECTRONIC DEVICE

(71) Applicant: SHENZHEN GOODIX TECHNOLOGY CO., LTD., Shenzhen (CN)

(72) Inventors: Shuang Wu, Shenzhen (CN); Dan Liu, Shenzhen (CN); Yufeng Liu, Shenzhen (CN); Wenhe Jin, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/449,368

(22) Filed: Jun. 22, 2019

(65) Prior Publication Data
US 2019/0310800 A1    Oct. 10, 2019

Related U.S. Application Data
(63) Continuation of application No. PCT/CN2018/078499, filed on Mar. 9, 2018.

(51) Int. Cl.
*G06F 3/06* (2006.01)
*G11C 29/38* (2006.01)

(52) U.S. Cl.
CPC .......... *G06F 3/0659* (2013.01); *G06F 3/0604* (2013.01); *G06F 3/0673* (2013.01); *G11C 29/38* (2013.01)

(58) Field of Classification Search
CPC .... G06F 3/0659; G06F 3/0673; G06F 3/0604; G06F 12/0638; G06F 12/02;
(Continued)

(56) References Cited

U.S. PATENT DOCUMENTS

2009/0043957 A1*  2/2009  Davis .............. G11C 15/00
                                                      711/108
2009/0248955 A1   10/2009  Tamada
(Continued)

FOREIGN PATENT DOCUMENTS

CN    107301042 A    10/2017
CN    107402831 A    11/2017
CN    107578796 A     1/2018

OTHER PUBLICATIONS

Huamin Cao et al. "Efficient built-in self-repair strategy for embedded SRAM with selectable redundancy". 2012 2nd International Conference on Consumer Electronics, Communications and Networks, CECNet 2012—Proceedings. 10.1109/CECNet.2012. 6201846, Apr. 21, 2012, 4 pages total.
(Continued)

*Primary Examiner* — James C Kerveros

(57) ABSTRACT

Disclosed is a method for accessing a code Static Random Access Memory (SRAM) and an electronic device. The method is applied to an electronic device including a first controller, a code SRAM and an in circuit emulator (ICE); and the method includes: receiving, by the ICE, a first address at which the first controller accesses the code SRAM; transmitting, by the ICE, a first code to the first controller if the first address is the same as a second address, where the second address is an address corresponding to an abnormal address cell in the code SRAM, and the first code is a correct code of the abnormal address cell; or obtaining, by the ICE, a second code corresponding to the first address from the code SRAM, and transmitting the second code to the first controller, if the first address is different from the second address.

11 Claims, 3 Drawing Sheets

(58) Field of Classification Search
CPC ....... G06F 2212/251; G06F 2212/1032; G06F 11/1048; G11C 29/38; G11C 29/76; G11C 29/72; G11C 29/56; G11C 29/4401
USPC .......................................................... 714/718
See application file for complete search history.

(56) References Cited

U.S. PATENT DOCUMENTS

2012/0246544 A1    9/2012  Resnick et al.
2017/0315816 A1   11/2017  Smith
2018/0129453 A1*  5/2018  Kim ..................... G06F 3/0604

OTHER PUBLICATIONS

Kanad Chakraborty et al. "A physical design tool for built-in self-repairable static RAMs," 714-718. 10.1109/DATE.1999.761208, Mar. 9, 1999, 5 pages total.

* cited by examiner

100 | Receiving, by the ICE, a first address at which the first controller accesses the code SRAM | ∼ S110

Transmitting, by the ICE, a first code to the first controller if the first address is the same as the second address, where the second address is an address corresponding to an abnormal address cell in the code SRAM, and the first code is a correct code of the abnormal address cell; or, obtaining, by the ICE, a second code corresponding to the first address from the code SRAM, and transmitting the second code to the first controller, if the first address is different from the second address | ∼ S120

FIG. 1

METHOD FOR ACCESSING CODE SRAM AND ELECTRONIC DEVICE

CROSS REFERENCE TO RELATED APPLICATIONS

The present disclosure is a continuation of international application No. PCT/CN2018/078499, filed on Mar. 9, 2018, of which is hereby incorporated by reference in its entirety.

TECHNICAL FIELD

The present application relates to the field of storage, and more particularly, to a method for accessing a code SRAM and an electronic device.

BACKGROUND

Due to process variation and other reasons of a code static random access memory (Static Random Access Memory, SRAM) in a chip, an abnormality in content of some addresses may be caused, for example, some bits will jump between 0 and 1, while some bits are fixed to 0 or 1, which in turn causes a microprogrammed control unit (MCU) to execute an erroneous code, leading to a fatal problem. Meanwhile, the bits cannot be read, written and revised in a normal way either. After such problem occurs, it is determined as an early death of the chip. At this stage, a common solution for chips suffering an early death is to recall the chips, however, such workload is heavier, a period is long, and some negative impact will be brought to chip design and manufacturing enterprises. Therefore, how to avoid a fatal problem caused by an erroneous code executed by an MCU after an abnormality occurs in content of some addresses in a code SRAM is an urgent problem to be solved.

SUMMARY

The present application provides a method for accessing a code SRAM and an electronic device. After an abnormality occurs in content of some addresses in the code SRAM, an in circuit emulator prevents an operation abnormality in the code SRAM, thereby improving reliability of a system.

In a first aspect, provided is a method for accessing a code SRAM, where the method is applied to an electronic device, and the electronic device includes a first controller, a code SRAM and an in circuit emulator (ICE); and
the method includes:
receiving, by the in circuit emulator, a first address at which the first controller accesses the code SRAM;
transmitting, by the in circuit emulator, if the first address is the same as a second address, a first code to the first controller, where the second address is an address corresponding to an abnormal address cell in the code SRAM, and the first code is a correct code of the abnormal address cell; or
obtaining, by the in circuit emulator, if the first address is different from the second address, a second code corresponding to the first address from the code SRAM, and transmitting the second code to the first controller.

In an embodiment of the present application, an in circuit emulator may replace a code of an abnormal address cell in a code SRAM with a correct code of the address cell after the abnormal address cell appears in the code SRAM, such that an electronic device could still work normally after the abnormal address cell appears in the code SRAM of the electronic device, thereby improving reliability of a system and avoiding losses caused by recycling of the electronic device.

In some possible implementation manners, the in circuit emulator includes an address comparing module, and
after the receiving, by the in circuit emulator, the first address at which the first controller accesses the code SRAM, the method further includes:
comparing, by the address comparing module, the first address with the second address.

In some possible implementation manners, the method further includes:
executing, by the first controller, a code obtained from the in circuit emulator.

In some possible implementation manners, the first controller is an MCU.

In some possible implementation manners, the electronic device further includes a second controller, and
before the receiving, by the in circuit emulator, the first address at which the first controller accesses the code SRAM, the method further includes:
checking, by the second controller, all address cells in the code SRAM;
recording, by the second controller, the second address corresponding to the address cell when there is the address cell in the code SRAM;
determining, by the second controller, the first code according to the second address; and
transmitting, by the second controller, the second address and the first code to the in circuit simulator.

In some possible implementation manners, the code SRAM includes a memory built-in self-test module, and
the checking, by the second controller, all the address cells in the code SRAM includes: controlling, by the second controller, the memory built-in self-test module to be started; and
checking, by the memory built-in self-test module, all the address cells in the code SRAM.

In some possible implementation manners, the determining, by the second controller, the first code according to the second address includes:
querying, by the second controller, the first code in standard firmware according to the second address, where the standard firmware stores correct codes of all the address cells in the code SRAM.

In some possible implementation manners, the in circuit emulator includes an address register and a code register, and
the transmitting, by the second controller, the second address and the first code to the in circuit simulator includes:
transmitting, by the second controller, the second address to the address register; and
transmitting, by the second controller, the first code to the code register.

In some possible implementation manners, the first controller is an MCU, and the second controller is a central processing unit (CPU).

In a second aspect, provided is an electronic device, where the electronic device includes a first controller, a code SRAM and an in circuit emulator; and the in circuit emulator is configured to receive a first address at which the first controller accesses the code SRAM;
if the first address is the same as a second address, the in circuit emulator is further configured to transmit a first code to the first controller, where the second address is an address corresponding to an abnormal address cell in the code SRAM, and the first code is a correct code of the abnormal address cell; or if the first address is different from the second address, the in circuit emulator is further configured to obtain a second code corresponding to the first address from the code SRAM, and transmit the second code to the first controller.

In an embodiment of the present application, an in circuit emulator may replace a code of an abnormal address cell in a code SRAM with a correct code of the address cell after the abnormal address cell appears in the code SRAM, such that an electronic device could still work normally after the abnormal address cell appears in the code SRAM of the electronic device, thereby improving reliability of a system and avoiding losses caused by recycling of the electronic device.

In some possible implementation manners, the in circuit emulator includes an address register and a code register, and the address register is configured to store the second address transmitted by the second controller; and the code register is configured to store the first code transmitted by the second controller.

In some possible implementation manners, the in circuit emulator includes an address comparing module and a multiplexer, and after the in circuit emulator receives the first address at which the first controller accesses the code SRAM, the address comparing module is configured to compare the first address with the second address;

if the first address is the same as the second address, the address comparing module is further configured to control the multiplexer to transmit the first code to the first controller; or if the first address is different from the second address, the address comparing module is further configured to control the multiplexer to transmit the second code to the first controller.

In some possible implementation manners, the first controller is configured to execute a code obtained from the in circuit emulator.

In some possible implementation manners, the first controller is an MCU.

In some possible implementation manners, the electronic device further includes a second controller, and before the in circuit emulator receives the first address at which the first controller accesses the code SRAM, the second controller is configured to check all address cells in the code SRAM; when there is the address cell in the code SRAM, the second controller is further configured to record the second address corresponding to the address cell;

the second controller is further configured to determine the first code according to the second address; and the second controller is further configured to transmit the second address and the first code to the in circuit simulator.

In some possible implementation manners, the code SRAM includes a memory built-in self-test module, and the second controller is further configured to control the memory built-in self-test module to be started; and the memory built-in self-test module is configured to check all the address cells in the code SRAM.

In some possible implementation manners, the second controller is configured to:

query the first code in standard firmware according to the second address, where the standard firmware stores correct codes of all the address cells in the code SRAM.

In some possible implementation manners, the first controller is an MCU, and the second controller is a CPU.

In a third aspect, provided is a computer storage medium having stored therein program codes, the program codes being operative to indicate execution of the method in the above first aspect or any possible implementation manner in the first aspect.

In a fourth aspect, provided is a computer program product comprising instructions which, when run on the computer, cause a computer to execute the method in the above first aspect or any possible implementation manner in the first aspect.

BRIEF DESCRIPTION OF THE DRAWINGS

FIG. 1 is a schematic flowchart of a method for accessing a code SRAM according to an embodiment of the present application.

DESCRIPTION OF EMBODIMENTS

Figure 2:
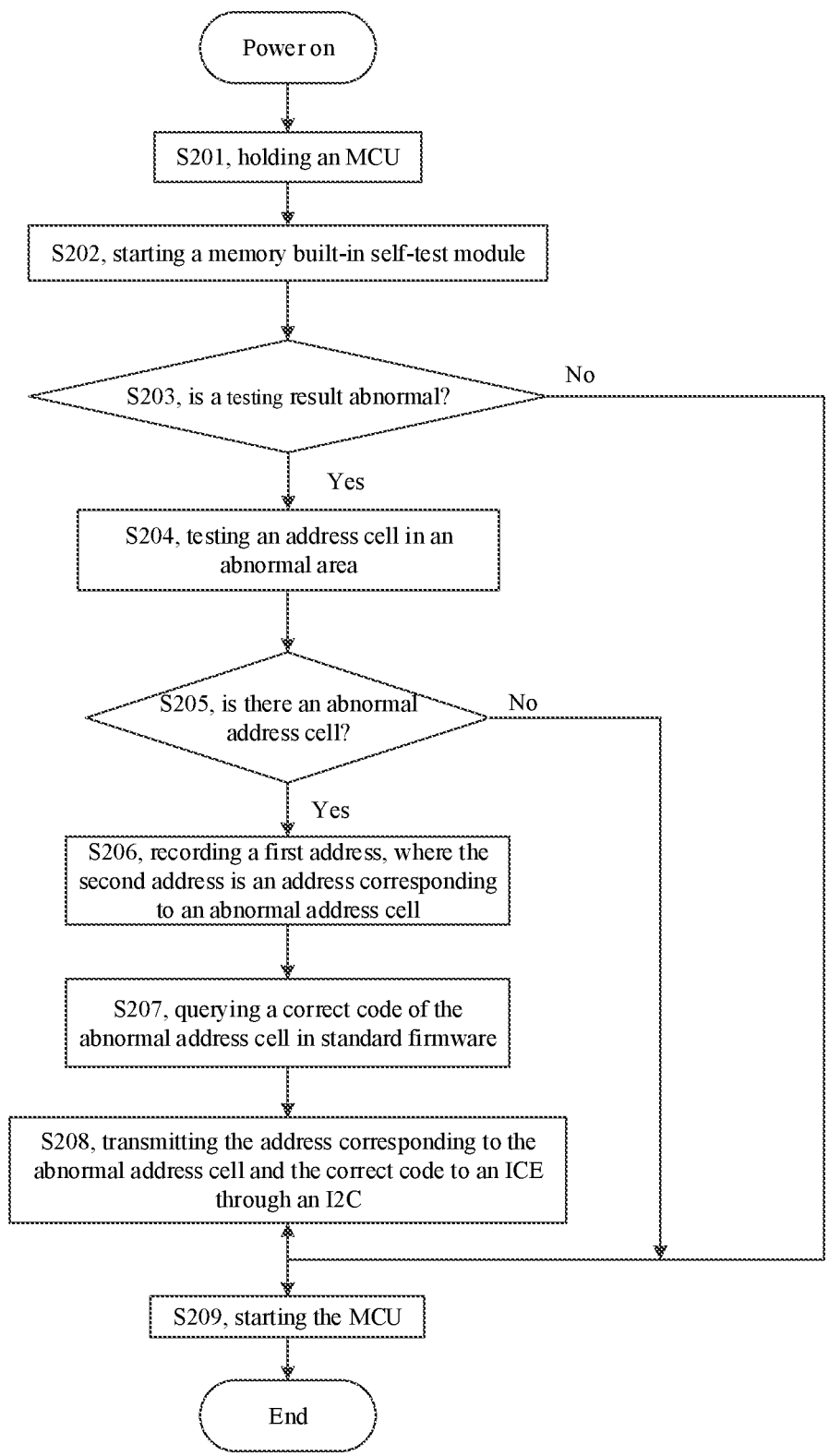
FIG. 2 is a flow of accessing a code SRAM according to an embodiment of the present application.

A clear description of technical solutions provided in embodiments of the present application will be given below, in conjunction with the accompanying drawings in the embodiments of the present application.

It should be understood that an SRAM may be divided into a data SRAM and a code SRAM. The embodiments of the present application are mainly applied to a code SRAM.

It should also be understood that an SRAM is integrated inside a chip. In a normal use process, if an abnormality in content of some addresses is caused by process variation and other reasons of the SRAM, it may lead to an early death of a chip.

It should also be understood that as an important debugging tool for embedded system development, an ICE can be used for breakpoint debugging. During the breakpoint debugging, a code address of a breakpoint can be calculated after setting the program breakpoint. By comparing an address in a programmer counter (PC) with the address of the breakpoint during execution of a program, an operation of a CPU may be held when the program is executed at the address of the breakpoint so as to give a developer time to analyze the state of a system at this time.

In an embodiment of the present application, when an address comparing module in an ICE is used to implement address comparison, a code replacing module (for example, a multiplexer) is added in the ICE to replace a code of an abnormal address cell in a code SRAM with a correct code of the address cell, such that an electronic device could still work normally after the abnormal address cell appears in the code SRAM of the electronic device, thereby improving reliability of a system and avoiding losses caused by recall of the electronic device.

Hereinafter, a method for accessing a code SRAM according to an embodiment of the present application will be described in detail with reference to FIG. 1 and FIG. 2.

FIG. 1 is a schematic flowchart of a method for accessing a code SRAM according to an embodiment of the present application. It should be understood that FIG. 1 illustrates steps or operations of the method, but these steps or operations are merely examples, and other operations or variations of the various operations in FIG. 1 may also be performed in the embodiment of the present application. The method 100 may be applied to an electronic device, and the electronic device includes a first controller, a code SRAM and an ICE.

S110, the ICE receives a first address at which the first controller accesses the code SRAM.

The first controller may be an MCU.

The code SRAM may be used to store a code, and the first controller reads and executes the code in the code SRAM through the ICE.

It should be understood that the first address may be an address corresponding to any address cell in the code SRAM.

S120, whether the first address is the same as a second address is determined; if the first address is the same as the second address, the ICE transmits a first code to the first controller, where the second address is an address corresponding to an abnormal address cell in the code SRAM, and the first code is a correct code of the abnormal address cell; or if the first address is different from the second address, the ICE obtains a second code corresponding to the first address from the code SRAM, and transmits the second code to the first controller.

For example, in an abnormal address cell, some bits will jump between 0 and 1, and some bits are fixed at 0 or 1, which results in that the bits cannot be read, written and revised in a normal way.

The second address may be stored in the ICE, and after the first address is received, the second address is directly called for comparison with the first address.

For example, the second address may be stored in an address register of the ICE in advance.

The first code may be stored in the ICE, and when the first address is the same as the second address, the first code is directly called, and the first code is transmitted to the first controller.

For example, the first code may be stored in a code register of the ICE in advance.

For example, there are three abnormal address cells in a code SRAM, i.e., an address cell a, an address cell b and an address cell c; the address cell a corresponds to an address A, the address cell b corresponds to an address B, the address cell c corresponds to an address C; and a code X is a correct code of the address cell a, a code Y is a correct code of the address cell b, and a code Z is a correct code of the address cell c; the address A is stored in an address register 11, the address B is stored in an address register 12, and the address C is stored in an address register 13; and the code X is stored in a code register 21, the code Y is stored in a code register 22, and the code Z is stored in a code register 23.

Optionally, the ICE may obtain the second address from a CPU, and store the second address in an address register in advance, and obtain the first code from the CPU, and store the first code in a code register in advance. When the MCU reads and executes the code in the code SRAM through the ICE, the ICE could call the second address directly from the address register and the first code from the code register.

Optionally, the ICE includes an address comparing module and a multiplexer.

The address comparing module is connected to the address register, the first controller and the multiplexer, and the multiplexer is connected to the code register, the code SRAM, and the first controller.

Specifically, the address comparing module is configured to compare the first address with the second address, and transmit first control information to the multiplexer if the first address is the same as the second address, where the first control information is used to control the multiplexer to transmit the first code to the first controller; or transmit second control information to the multiplexer if the first address is different from the second address, where the second control information is used to control the multiplexer to obtain a second code corresponding to the first address from the code SRAM, and transmit the second code to the first controller.

Specifically, after receiving the first control information, the multiplexer transmits the first code to the first controller; or after receiving the second control information, the multiplexer obtains a second code corresponding to the first address from the code SRAM, and transmits the second code to the first controller.

Optionally, the first controller executes a code obtained from the ICE.

Optionally, as an embodiment, the foregoing electronic device may be a chip such as a touch chip, a fingerprint identification chip, a display chip, or the like. For example, the electronic device is a fingerprint identification chip, and the fingerprint identification chip includes an MCU, a code SRAM and an ICE. The MCU reads and executes a code in the code SRAM through the ICE, such that the electronic device could still work normally after an abnormal address cell appears in the code SRAM of the electronic device, thereby improving reliability of a system and avoiding losses caused by recall of the electronic device.

Optionally, as an embodiment, the foregoing electronic device may also be a device having an MCU, a code SRAM, an ICE and a CPU, for example, a mobile phone or a tablet, and the MCU, the code SRAM and the ICE may be integrated in a chip of the electronic device, such as a touch chip, a fingerprint identification chip, a display chip, or the like. The MCU reads and executes a code in the code SRAM through the ICE, such that the electronic device could still work normally after an abnormal address cell appears in the code SRAM of the touch chip of the electronic device for example, thereby improving reliability of a system of the electronic device.

Specifically, the electronic device further includes a second controller, for example, the second controller is a CPU.

Optionally, before the ICE receives the first address at which the first controller accesses the code SRAM (S110), the method 100 further includes:

checking, by the second controller, all address cells in the code SRAM;

recording, by the second controller, the second address corresponding to the abnormal address cell when there is the abnormal address cell in the code SRAM;

determining, by the second controller, the stored first code of the abnormal address cell according to the second address; and transmitting, by the second controller, the second address and the first code to the ICE.

That is, the second controller predetermines the second address and the first code, and feeds back the second address and the first code to the ICE, such that the ICE could directly call the second address and the first code when the MCU reads and executes the code in the code SRAM through the ICE.

Optionally, the second address is stored in the address register of the ICE, and the first code is stored in the code register of the ICE.

Optionally, the code SRAM includes a memory built-in self-test (Memory Bist) module, and the second controller may check all the address cells in the code SRAM through the memory built-in self-test module.

Specifically, the second controller controls the memory built-in self-test module to be started, and the memory built-in self-test module checks all the address cells in the code SRAM.

Optionally, the second controller may determine the first code by querying standard firmware.

Specifically, after determining the second address, the second controller queries the first code in the standard firmware according to the second address, where the standard firmware stores correct codes of all the address cells in the code SRAM. Therefore, the second controller could timely feedback the second address and the first code to the ICE, such that the ICE could call the second address directly from the address register and the first code from the code register when the MCU reads and executes the code in the code SRAM through the ICE.

The standard firmware may be firmware stored in a flash of the second controller for updating a chip such as a touch chip and a fingerprint chip.

Optionally, the second controller transmits the second address and the first code to the ICE through an I2C bus.

Hereinafter, a flow of accessing a code SRAM according to an embodiment of the present application will be described in detail with reference to FIG. 2.

It should be understood that an example shown in FIG. 2 is for helping those skilled in the art better understand embodiments of the present application, rather than for limiting the scope of the embodiments of the present application. It will be obvious for those skilled in the art to make various equivalent modifications or variations according to FIG. 2 as illustrated, which also fall within the scope of the embodiments of the present application.

FIG. 2 is a flow of accessing a code SRAM according to an embodiment of the present application.

S201, an MCU is held.

Specifically, a CPU controls the MCU to be held.

S202, a memory built-in self-test module is started.

The CPU controls the memory built-in self-test module to be started.

S203, is a testing result abnormal?

When the testing result of the memory built-in self-test module is normal, step S209 is performed.

When the testing result of the memory built-in self-test module is abnormal, step S204 is performed.

S204, an address cell in an abnormal area is tested.

For example, 0x55/0xAA is written into the abnormal area and read back for checking.

It should be understood that 0x55/0xAA is two hexadecimal numbers commonly used in memory testing, and can quickly test out an abnormal address cell in the memory.

The memory built-in self-test module writes 0x55/0xAA to the abnormal area and reads it back for checking.

S205, is there an abnormal address cell?

For example, when there is no abnormal address cell after writing 0x55/0xAA and reading it back for checking, step S209 is performed.

For another example, when there is an abnormal address cell after writing 0x55/0xAA and reading it back for checking, step S206 is performed.

S206, a second address is recorded, where the second address is an address corresponding to an abnormal address cell.

The CPU records the second address.

S207, a first code is queried in standard firmware, where the first code is a correct code of the abnormal address cell.

The CPU queries the first code in the standard firmware according to the second address, where the standard firmware stores correct codes of all address cells in the code SRAM.

S208, the second address and the first code are transmitted to an ICE through an I2C.

The CPU transmits the second address and the first code to the ICE through the I2C bus.

Optionally, the second address is stored in an address register, and the first code is stored in a code register.

S209, the MCU is started.

The MCU accesses the first address of the code SRAM through the ICE.

If the first address is the same as the second address, the ICE transmits the first code to the MCU; or if the first address is different from the second address, the ICE obtains a second code corresponding to the first address from the code SRAM, and transmits the second code to the first controller.

The MCU executes a code obtained from the ICE.

In an embodiment of the present application, an ICE may replace a code of an abnormal address cell in a code SRAM with a correct code of the address cell after the abnormal address cell appears in the code SRAM, such that an electronic device could still work normally after the abnormal address cell appears in the code SRAM of the electronic device, thereby improving reliability of a system and avoiding losses caused by recycling of the electronic device.

Figure 3:
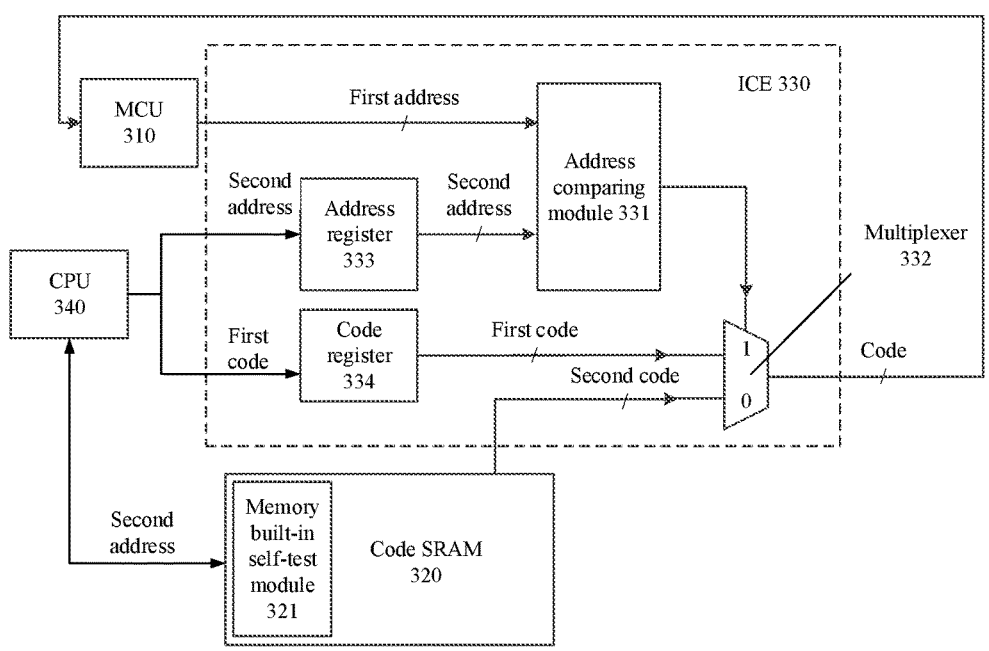
FIG. 3 is a schematic structural diagram of an electronic device according to an embodiment of the present application.

FIG. 3 is a schematic structural diagram of an electronic device 300 according to an embodiment of the present application. Optionally, as an embodiment, the electronic device 300 may be a chip such as a touch chip, a fingerprint identification chip, a display chip, etc. As shown in FIG. 3, the electronic device 300 includes an MCU 310, a code SRAM 320 and an ICE 330, and the electronic device 300 is controlled by a CPU 340. Optionally, as an embodiment, the electronic device 300 may also be a device having an MCU, a code SRAM, an ICE and a CPU. As shown in FIG. 3, the electronic device 300 includes an MCU 310, a code SRAM 320, an ICE 330 and a CPU 340.

Specifically, the ICE 330 includes an address comparing module 331, a multiplexer 332, an address register 333 and a code register 334; and the address register 333 stores a second address, and the second address is an address corresponding to an abnormal address cell in the code SRAM 320; or the code register 334 stores the first code, and the first code is a correct code of the abnormal address cell.

Specifically, the address comparing module 331 receives a first address at which the MCU 310 accesses the code SRAM 320; and the address comparing module 331 compares the first address with the second address;

if the first address is the same as the second address, the address comparing module 331 transmits control information 1 to the multiplexer 332, and accordingly, the multiplexer 332 transmits the first code to the MCU 310; or if the first address is different from the second address, the address comparing module 331 transmits control information 0 to the multiplexer 332, and accordingly, the multiplexer 332 obtains a second code corresponding to the first address from the code SRAM 320, and transmits the second code to the MCU 310.

Optionally, the MCU 310 executes a code obtained from the ICE 330.

Optionally, before the address comparing module 331 receives the first address at which the MCU 310 accesses the code SRAM 320, the CPU 340 checks all address cells in the code SRAM 320;

when there is the abnormal address cell in the code SRAM 320, the CPU 340 records the second address corresponding to the abnormal address cell;

the CPU 340 determines the first code according to the second address; and the CPU 340 transmits the second address and the first code to the ICE 330.

Optionally, the second address is stored in the address register 333, and the first code is stored in the code register 334.

Specifically, the code SRAM 320 includes a memory built-in self-test module 321, the CPU 340 controls the memory built-in self-test module 321 to be started; and the memory built-in self-test module 321 checks all the address cells in the code SRAM 320.

Specifically, the CPU 340 queries the first code in standard firmware according to the second address, where the standard firmware stores correct codes of all the address cells in the code SRAM.

The standard firmware is firmware stored in a flash of the CPU 340 for updating a chip such as a touch chip and a fingerprint chip.

It should be understood that, in various embodiments of the present application, values of sequence numbers of the above-mentioned various processes do not mean an order of execution which should be determined based upon functionalities and internal logics thereof, rather than setting any limitation to implementation of the embodiment of the present application.

Those of ordinary skill in the art may be aware that, units and algorithm steps of the examples described in the embodiments disclosed in this paper may be implemented by electronic hardware, computer software, or a combination of the two. Whether these functions are performed by hardware or software depends on particular applications and designed constraint conditions of the technical solutions. Persons skilled in the art may use different methods to implement the described functions for each particular application, but it should not be considered that the implementation goes beyond the scope of this application.

Those skilled in the art to which the present application pertains may clearly understand that, for convenience and simplicity of description, for the specific working processes of the system, the apparatus and the units described above, please refer to corresponding processes in the foregoing method embodiment, and they will not be repeated redundantly herein.

In the several embodiments provided in the present application, it should be understood that, the disclosed system, device and method may be implemented in other manners. For example, the foregoing described apparatus embodiments are merely exemplary. For example, division of the units is merely logical function division and there may be other division manners in practical implementation. For example, multiple units or components may be combined or integrated into another system, or some features may be ignored or not executed. In addition, the shown or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separated, and parts shown as units may or may not be physical units, may be located in one position, or may be distributed on a plurality of network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

If the integrated unit is implemented in the form of the software functional unit and is sold or used as an independent product, it may be stored in a computer readable storage medium. Based on such understanding, the technical solutions of the present application substantially, or the part of the present disclosure making contribution to the prior art, or a part of the technical solution may be embodied in the form of a software product, and the computer software product is stored in a storage medium, which includes multiple instructions enabling computer equipment (which may be a personal computer, a server, network equipment or the like) to execute all of or part of the steps in the methods of the embodiments of the present application. The foregoing storage medium includes a variety of media capable of storing program codes, such as a USB disk, a mobile hard disk, a read-only memory (ROM), a random access memory (RAM), a magnetic disk, an optical disk or the like.

Described above are the specific embodiments of the present application only, but the protection scope of the present application is not limited to this, those skilled who are familiar with the art could readily think of variations or substitutions within the technical scope disclosed by the present application, and these variations or substitutions shall fall within the protection scope of the present application. Therefore, the protection scope of the present application should be determined with reference to the protection scope of the claims.

What is claimed is:

1. A method for accessing a code Static Random Access Memory (SRAM), wherein the method is applied to an electronic device, and the electronic device comprises a first controller, a second controller, a code SRAM and an in circuit emulator, the code SRAM comprises a memory built-in self-test module, the first controller is a microprogrammed control unit (MCU), and the second controller is a central processing unit (CPU), the method comprises:

receiving, by the in circuit emulator, a first address at which the first controller accesses the code SRAM;

transmitting, by the in circuit emulator, a first code to the first controller if the first address is the same as a second address, wherein the second address is an address corresponding to an abnormal address cell in the code SRAM, and the first code is a correct code of the abnormal address cell;

obtaining, by the in circuit emulator, a second code corresponding to the first address from the code SRAM if the first address is different from the second address, and transmitting the second code to the first controller by the in circuit emulator;

wherein before the receiving, by the in circuit emulator, the first address at which the first controller accesses the code SRAM, the method further comprises:

controlling, by the second controller, the memory built-in self-test module to be started;

checking, by the memory built-in self-test module, all the address cells in the code SRAM;

recording, by the second controller, the second address corresponding to the address cell when there is the address cell in the code SRAM;

determining, by the second controller, the first code according to the second address; and transmitting, by the second controller, the second address and the first code to the in circuit simulator.

2. The method according to claim 1, wherein the in circuit emulator comprises an address comparing module, and after the receiving, by the in circuit emulator, the first address at which the first controller accesses the code SRAM, the method further comprises:

comparing, by the address comparing module, the first address with the second address.

3. The method according to claim 1, wherein the method further comprises:

executing, by the first controller, a code obtained from the in circuit emulator.

4. The method according to claim 1, wherein the determining, by the second controller, the first code according to the second address comprises:

querying, by the second controller, the first code in standard firmware according to the second address, wherein the standard firmware stores correct codes of all the address cells in the code SRAM.

5. The method according to claim 1, wherein the in circuit emulator comprises an address register and a code register, and the transmitting, by the second controller, the second address and the first code to the in circuit simulator comprises:

transmitting, by the second controller, the second address to the address register; and transmitting, by the second controller, the first code to the code register.

6. An electronic device comprising:

a first controller being a microprogrammed control unit (MCU);

a second controller being a central processing unit (CPU);

a code Static Random Access Memory (SRAM) comprising a memory built-in self-test module; and an in circuit emulator;

wherein the in circuit emulator is configured to:
receive a first address at which the first controller accesses the code SRAM;
if the first address is the same as a second address, transmit a first code to the first controller, wherein the second address is an address corresponding to an abnormal address cell in the code SRAM, and the first code is a correct code of the abnormal address cell;
if the first address is different from the second address, obtain a second code corresponding to the first address from the code SRAM, and transmit the second code to the first controller;

wherein before the in circuit emulator receives the first address at which the first controller accesses the code SRAM,
the second controller is configured to control the memory built-in self-test module to be started, and the memory built-in self-test module is configured to check all the address cells in the code SRAM;
when there is the address cell in the code SRAM, the second controller is further configured to record the second address corresponding to the address cell;
the second controller is further configured to determine the first code according to the second address; and
the second controller is further configured to transmit the second address and the first code to the in circuit simulator.

7. The electronic device according to claim 6, wherein the in circuit emulator comprises an address comparing module and a multiplexer, and after the in circuit emulator receives the first address at which the first controller accesses the code SRAM, the address comparing module is configured to compare the first address with the second address;

if the first address is the same as the second address, the address comparing module is further configured to control the multiplexer to transmit the first code to the first controller; or if the first address is different from the second address, the address comparing module is further configured to control the multiplexer to transmit the second code to the first controller.

8. The electronic device according to claim 6, wherein the first controller is configured to execute a code obtained from the in circuit emulator.

9. The electronic device according to claim 6, wherein the first controller is an MCU, and the second controller is a CPU.

10. The electronic device according to claim 6, wherein the second controller is configured to:

query the first code in standard firmware according to the second address, wherein the standard firmware stores correct codes of all the address cells in the code SRAM.

11. The electronic device according to claim 6, wherein the in circuit emulator comprises an address register and a code register, and the address register is configured to store the second address transmitted by the second controller; and the code register is configured to store the first code transmitted by the second controller.

* * * * *